United States Patent
Tanabe

(10) Patent No.: US 8,773,918 B2
(45) Date of Patent: Jul. 8, 2014

(54) SEMICONDUCTOR MEMORY DEVICE AND METHOD OF WRITING INTO SEMICONDUCTOR MEMORY DEVICE

(71) Applicant: Fujitsu Semiconductor Limited

(72) Inventor: Ryo Tanabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 9 days.

(21) Appl. No.: 13/691,006

(22) Filed: Nov. 30, 2012

(65) Prior Publication Data

US 2013/0176796 A1 Jul. 11, 2013

(30) Foreign Application Priority Data

Jan. 10, 2012 (JP) .................................. 2012-002236

(51) Int. Cl.
*G11C 7/00* (2006.01)

(52) U.S. Cl.
USPC .................................................. 365/189.011

(58) Field of Classification Search
USPC .................................................. 365/189.011
See application file for complete search history.

(56) References Cited

U.S. PATENT DOCUMENTS

| 7,269,077 B2 * | 9/2007 | Chiu et al. ................ 365/189.05 |
| 2006/0171191 A1 * | 8/2006 | Chiu et al. ..................... 365/154 |
| 2006/0262628 A1 | 11/2006 | Nii et al. |
| 2011/0069574 A1 | 3/2011 | Hirabayashi |
| 2012/0206988 A1 * | 8/2012 | Song et al. ..................... 365/203 |

FOREIGN PATENT DOCUMENTS

| JP | 2007-004960 A | 1/2007 |
| JP | 2009-295246 A | 12/2009 |
| JP | 2011-065727 A | 3/2011 |

* cited by examiner

*Primary Examiner* — Huan Hoang
*Assistant Examiner* — Pablo Huerta
(74) *Attorney, Agent, or Firm* — Arent Fox LLP

(57) ABSTRACT

The semiconductor memory device includes a memory cell, a pair of bit lines and a cell power line connected to the memory cell, a first switch connected to the bit lines and a power voltage line, a second switch connected to the cell power line and a write assist cell power line, and a write control circuit configured to control the bit lines, the first switch and the second switch, wherein the write control circuit applies a first voltage of a high level to one bit line and a second voltage of a low level to the other bit line, connects one bit line to the power voltage line and disconnects the other bit line from the power voltage line by the first switch, and then connects the cell power line to the write assist cell power line lower which is than the first voltage by the second switch.

10 Claims, 12 Drawing Sheets

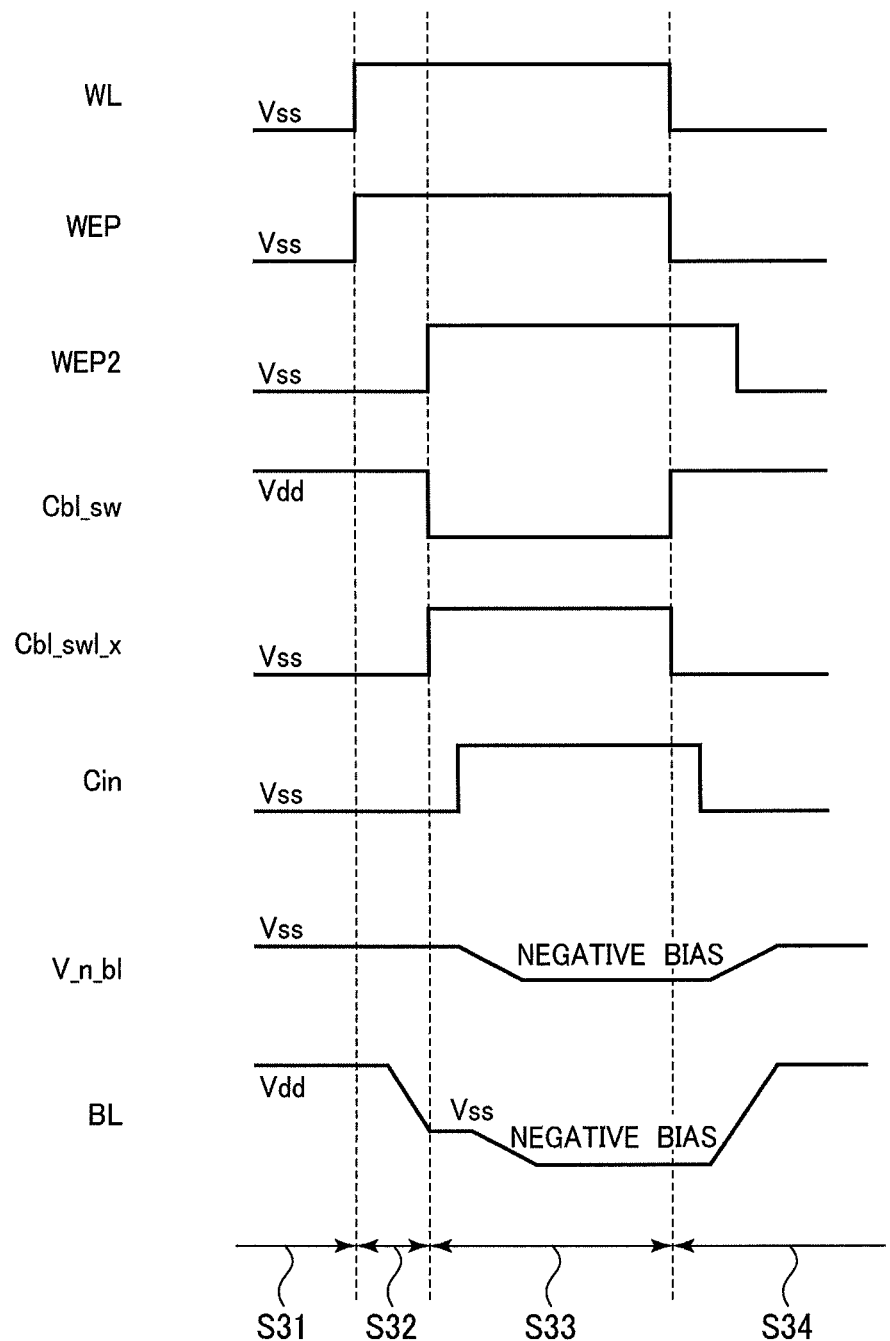

SEMICONDUCTOR MEMORY DEVICE AND METHOD OF WRITING INTO SEMICONDUCTOR MEMORY DEVICE

CROSS-REFERENCE TO RELATED APPLICATION

This application is based upon and claims the benefit of priority of the prior Japanese Patent Application No. 2012-002236, filed on Jan. 10, 2012, the entire contents of which are incorporated herein by reference.

FIELD

The embodiments discussed herein are related to a semiconductor memory device and a method of writing into the semiconductor memory device.

BACKGROUND

As semiconductor memory devices are required to have larger capacities and low electric powered, the elements are increasingly downsized. However, the development of the recent scaling increases the characteristics fluctuations of the transistors, which lowers the operational margin of the SRAM and consequently makes difficult the stable writing at low source voltages.

As a technique to assist the writing operation of the SRAM, the write assist circuit has been positively used. The write assist circuit is divided largely in two modes. One mode lowers the power voltage of the memory cell and weakens the latch effect of the memory cell to facilitate the inversion of the data, i.e., facilitate the writing. The other mode makes upon writing the potential of the bit line on the side of writing zero a negative voltage, thereby increasing the potential width of the bit line to facilitate the writing. In view of the requirement of lowering the operational voltage, the latter mode provides more merit.

The followings are examples of related: Japanese Laid-open Patent Publication No. 2007-004960; Japanese Laid-open Patent Publication No. 2009-295246; and Japanese Laid-open Patent Publication No. 2011-065727.

The mode of making upon a writing the voltage of the bit line on the side of writing zero a negative voltage shifts the potential of the bit line on the side of writing zero from 0 V to a negative voltage by the effect of the capacitor connected to the bit line on the side of writing zero. However, for this mode, it is necessary to add for each bit line a capacitor having substantially the same capacitance associated with the bit line to a usual write circuit, which unavoidably increases the area of the peripheral circuit. The control circuit which generates and applies a negative voltage must be also provided for each bit line, which is also a cause for increasing the area of the peripheral circuit.

SUMMARY

According to one aspect of an embodiment, there is provided a semiconductor memory device including a memory cell, a pair of bit lines connected to the memory cell, a cell power line connected to the memory cell and having parasitic capacitors between the pair of bit lines, a first switch circuit which is connected to the pair of bit lines and a power voltage line, a second switch circuit which is connected to the cell power line and a write assist cell power line, and a write control circuit configured to control the pair of bit lines, the first switch circuit and the second switch circuit, wherein the write control circuit applies a first voltage of a high level to one bit line of the pair of bit lines and a second voltage of a low level to the other bit line of the pair of bit lines, connects said one bit line to the power voltage line and disconnects said the other bit line from the power voltage line by the first switch circuit, and then connects the cell power line to the write assist cell power line by the second switch circuit, and wherein a voltage of the write assist cell power line is lower than the first voltage.

According to another aspect of an embodiment, there is provided a semiconductor memory device including a memory cell, a pair of bit lines connected to the memory cell, a cell power line connected to the memory cell and having parasitic capacitors between the pair of bit lines, a first switch circuit which is connected to the pair of bit lines and a reference voltage line, a second switch circuit which is connected to the cell power line and a write assist cell power line, and a write control circuit configured to control the pair of bit lines, first switch circuit and the second switch circuit, wherein the write control circuit applies a first voltage of a high level to one bit line of the pair of bit lines and a second voltage of a low level to the other bit line of the pair of bit lines, connects said the other bit line to the reference voltage line and disconnects said one bit line from the reference voltage line by the first switch circuit, and then connects the cell power line to the write assist cell power line by the second switch circuit, and wherein a voltage of the write assist cell power line is higher than the first voltage.

According to further another aspect of an embodiment, there is provided a method of writing into a semiconductor memory device including a memory cell, a pair of bit lines connected to the memory cell, and a cell power line connected to the memory cell, including applying a first voltage to one bit line of the pair of bit lines and a second voltage to the other bit line of the pair of bit lines, floating said one bit line, clamping a voltage of said the other bit line to the second voltage, then shifting a voltage of the cell power line, and thereby shifting the voltage of said one bit line capacitively coupled with the cell power line to a third voltage, and writing in the memory cell by the first voltage applied to said one bit line and the third voltage applied to said the other bit line.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 12 is a time chart illustrating a method of writing into the semiconductor memory device according to the reference embodiment.

DESCRIPTION OF EMBODIMENTS

A First Embodiment

A semiconductor memory device and a method of writing into the same according to a first embodiment will be described with reference to FIGS. 1 to 6.

Figure 1:
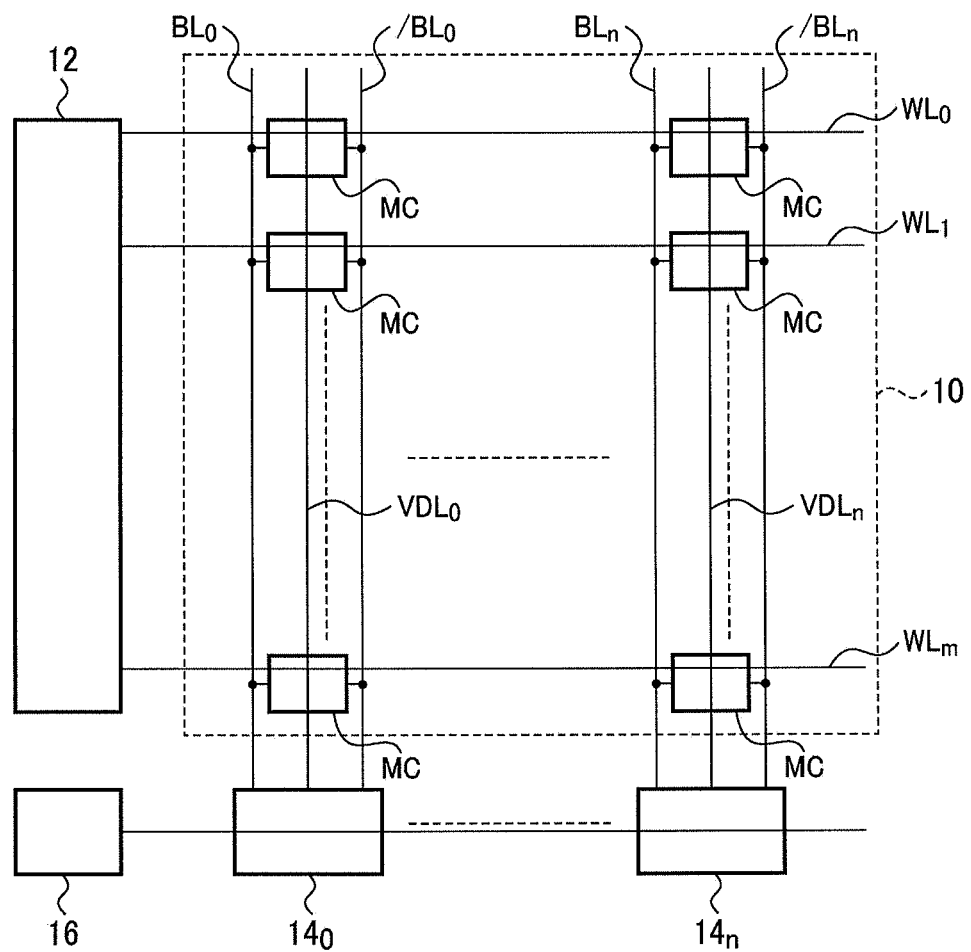
FIG. 1 is a circuit diagram illustrating a structure of a semiconductor memory device according to a first embodiment.
Figure 2:
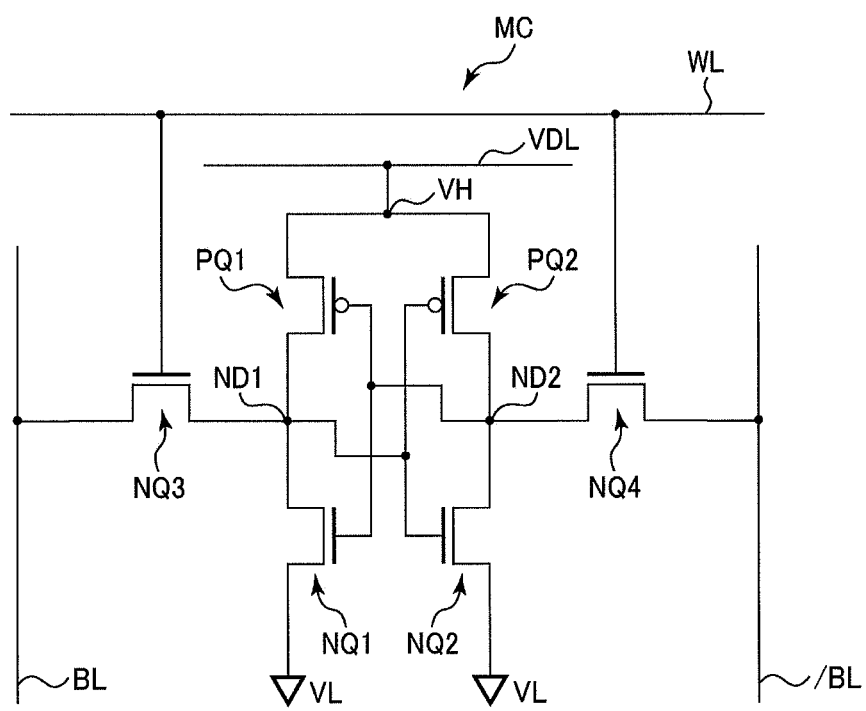
FIG. 2 is a circuit diagram illustrating a structure of a memory cell of the semiconductor memory device according to the first embodiment.
Figure 3:
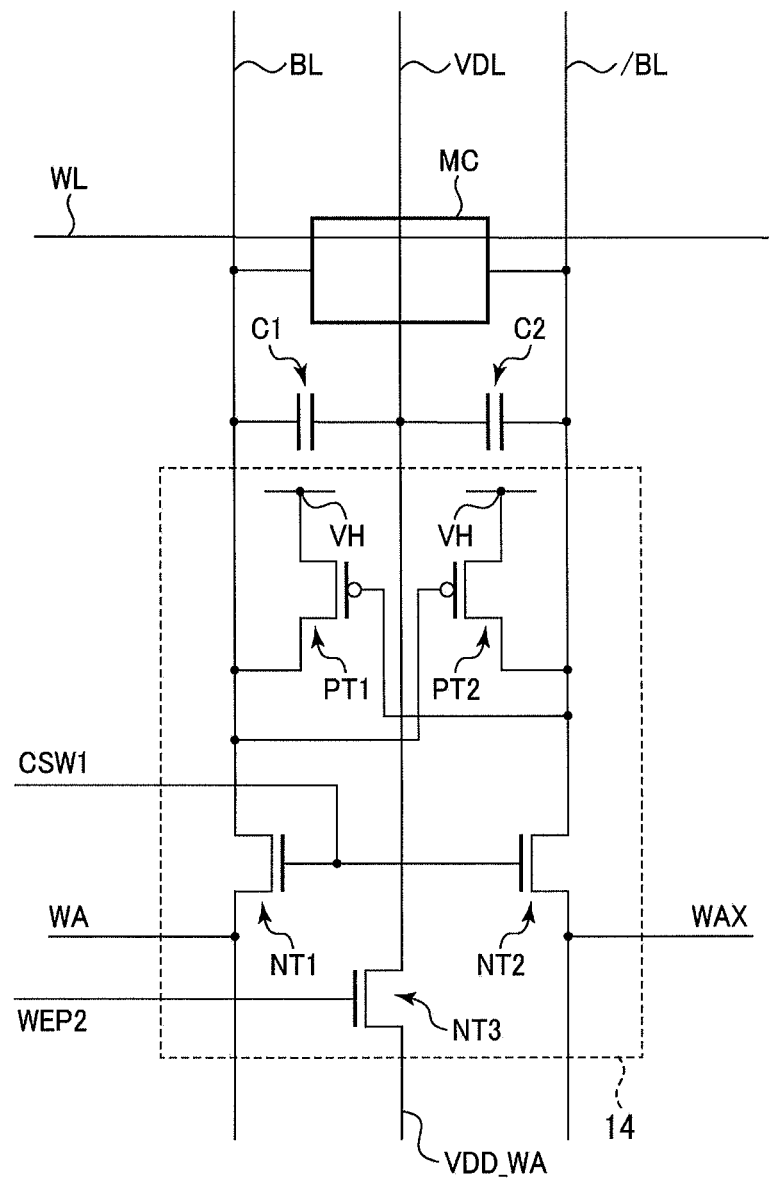
FIG. 3 is a circuit diagram illustrating a structure of a write circuit of the semiconductor memory device according to the first embodiment.
Figure 4:
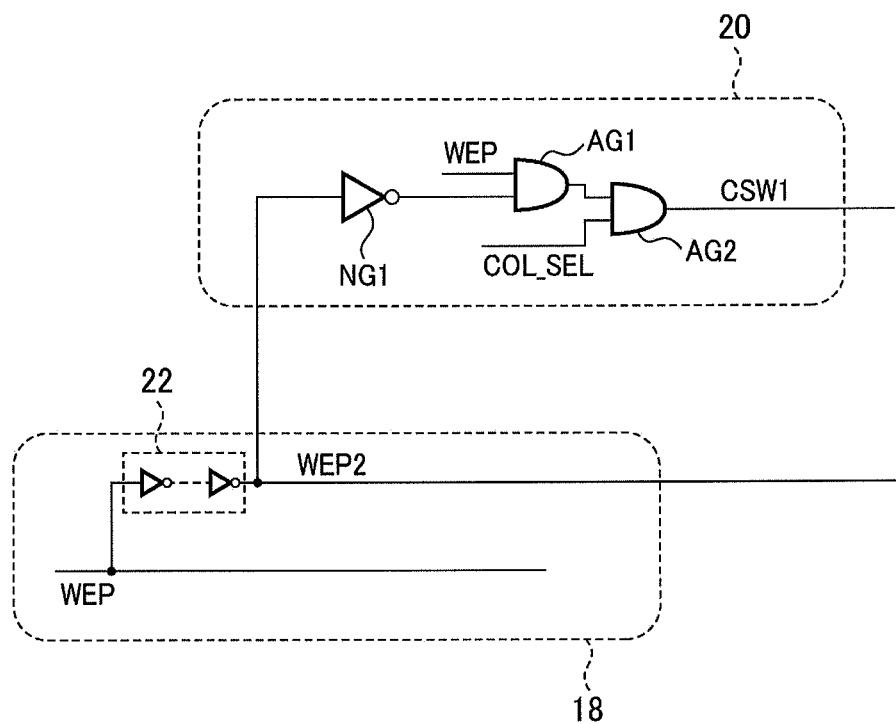
FIG. 4 is a circuit diagram illustrating a structure of a write control circuit of the semiconductor memory device according to the first embodiment.
Figure 5:
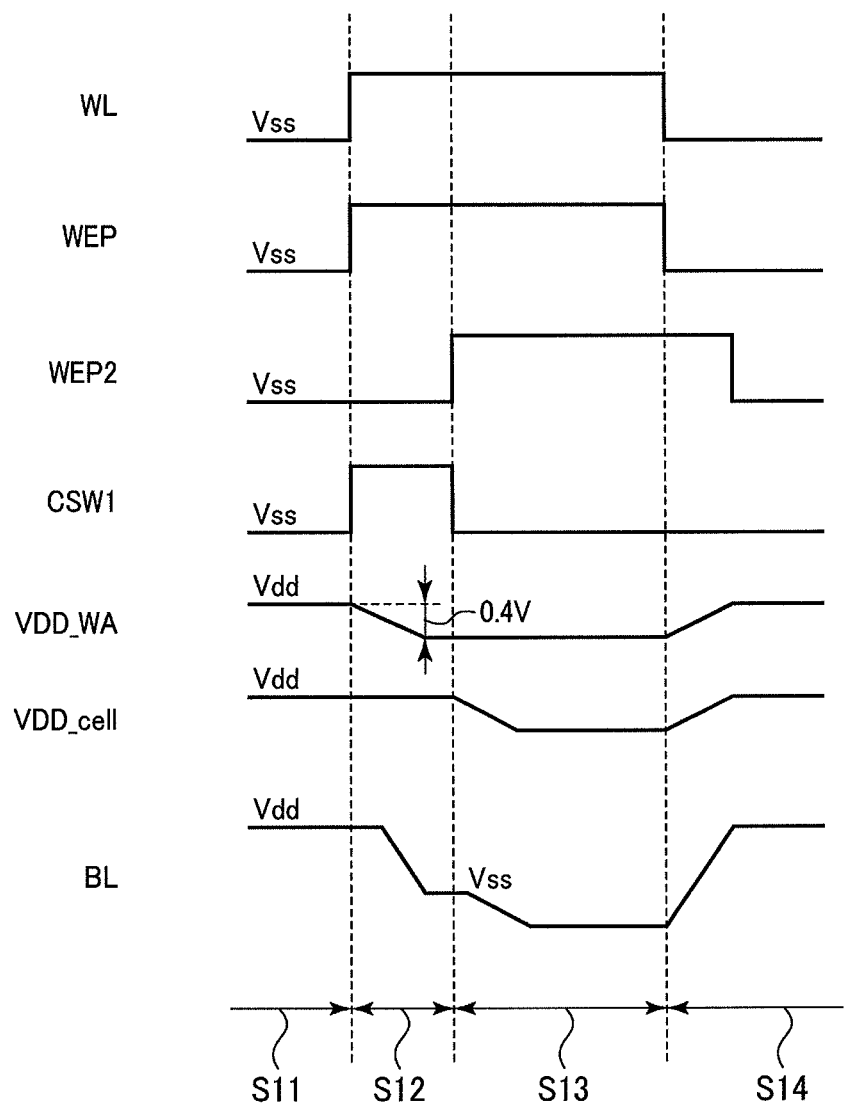
FIG. 5 is a time chart illustrating a method of writing into the semiconductor memory device according to the first embodiment.
Figure 6:
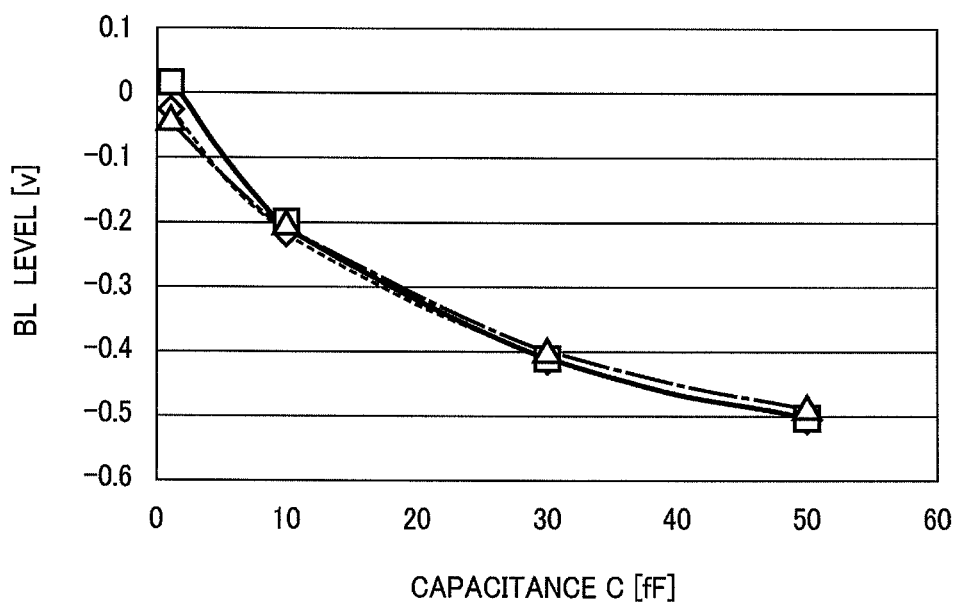
FIG. 6 is a graph illustrating a relationship between a parasitic capacitance between a bit line and a cell power line, and a voltage shift of the bit line.

FIG. 1 is a circuit diagram illustrating a structure of the semiconductor memory device according to the present embodiment. FIG. 2 is a circuit diagram illustrating a structure of a memory cell of the semiconductor memory device according to the present embodiment. FIG. 3 is a circuit diagram illustrating a structure of a write circuit of the semiconductor memory device according to the present embodiment. FIG. 4 is a circuit diagram illustrating a structure of a write control circuit of the semiconductor memory device according to the present embodiment. FIG. 5 is a time chart illustrating the method of writing into the semiconductor memory device according to the present embodiment. FIG. 6 is a graph illustrating a relationship between a parasitic capacitance between a bit line and a cell power line, and a voltage shift of the bit line.

First, the structure of the semiconductor memory device according to the present embodiment will be described with reference to FIGS. 1 to 4.

As illustrated in FIG. 1, the semiconductor memory device according to the present embodiment includes a memory cell array 10 having memory cells MC arranged along row direction and column direction in matrix. In the memory cell array 10, a plurality of word lines WL extended in row direction and a plurality of bit lines BL extended in column direction are provided. The word lines WL are, e.g., m-word lines $WL_0$-$WL_m$ arranged adjacent to each other in column direction. The bit lines BL are, e.g., n-sets of bit line pairs $BL_0$, /$BL_0$-$BL_n$, /$BL_n$ arranged adjacent to each other in row direction. Between the bit lines of the respective bit line pairs $BL_0$, /$BL_0$-$BL_n$, /$BL_n$, cell power lines $VDL_0$-$VDL_n$ which supply power source to the memory cells MC are respectively provided. The memory cells MC are provided respectively at the intersections between the word lines WL, and the bit line pairs BL, /BL and the cell source lines VDL.

A row select circuit 12 is connected to one ends of the word lines $WL_0$-$WL_m$. Write circuits $14_0$-$14_n$ are respectively connected to one ends of the respective bit line pairs $BL_0$, /$BL_0$-$BL_n$, /$BL_n$. A write control circuit 16 is connected to the write circuits $14_0$-$14_n$.

The memory cell MC is, e.g., a full CMOS SRAM as illustrated in FIG. 2. The memory cell MC includes a p-channel MOS transistor PQ1 connected between a high-side power node VH connected to a cell power line VDL and a storage node ND1, and an n-channel MOS transistor NQ1 connected between the storage node ND1 and a low-side power node VL. The memory cell MC further includes a p-channel MOS transistor PQ2 connected between the high-side power node VH and a storage node ND2, and an n-channel MOS transistor NQ2 connected between the storage node ND2 and a low-side power node VL. The gate electrode of the p-channel MOS transistor PQ1 and the gate electrode of the n-channel MOS transistor NQ1 are connected to the storage node ND2. The gate electrode of the p-channel MOS transistor PQ2 and the gate electrode of the n-channel MOS transistor NQ2 are connected to the storage node ND1. The storage node ND1 is connected to the bit line BL via an n-channel MOS transistor NQ3. The storage node ND2 is connected to the bit line /BL via an n-channel MOS transistor NQ4. The gate electrodes of the n-channel MOS transistors NQ3, NQ4 are connected to a word line WL.

The n-channel MOS transistor NQ1 and the p-channel MOS transistor PQ1, and the n-channel MOS transistor NQ2 and the p-channel MOS transistor PQ2 respectively form CMOS inverters. The inputs and the outputs of these CMOS inverts are cross-connected to form flip-flops, and the storage nodes ND1, ND2 hold complementary data.

As illustrated in FIG. 3, the write circuit 14 includes a p-channel MOS transistor PT1 and an n-channel MOS transistor NT1 connected to the bit line BL. The write circuit 14 further includes a p-channel MOS transistor PT2 and an n-channel MOS transistor NT2 connected to the bit line /BL. The write circuit 14 further includes an n-channel MOS transistor NT3 connected to the cell power line VDL.

The p-channel MOS transistor PT1 is connected between the high-side power node VH and the bit line BL and has the gate electrode connected to the bit line /BL. The p-channel MOS transistor PT2 as well as the p-channel MOS transistor PT1 is connected between the high-side power node VH and the bit line /BL and has the gate electrode connected to the bit line BL. These p-channel MOS transistors PT1, PT2 function as a switch circuit which, when one of a pair of the bit lines BL, /BL is at a high level, and the other is at a low level, clamps one to the power voltage and disconnects the other from the power source.

The gate electrode of the n-channel MOS transistor NT1 and the gate electrode of the n-channel MOS transistor NT2 are connected each other and connected to the write control circuit 16. To the gate electrode of the n-channel MOS transistor NT1 and the gate electrode of the n-channel MOS transistor NT2, a column control signal CSW1 is inputted.

A data line WA is connected to the bit line BL via the n-channel MOS transistor NT1. A data line WAX is connected to the bit line /BL via the n-channel MOS transistor NT2. To the data lines WA, WAX, complementary write signals are outputted from a write amplifier (not illustrated) upon writing in the memory cell MC.

A write assist cell power line VDD_WA is connected to the cell power line VDL via the n-channel MOS transistor NT3. The n-channel MOS transistor NT3 functions as a switch circuit which switches a voltage to be applied to the cell power line VDL upon writing from the power voltage to a write assist voltage which is lower than the power voltage.

The gate electrode of the n-channel MOS transistor NT3 is connected to the write control circuit 16. To the gate electrode of the n-channel MOS transistor NT3, a write control signal WEP2 outputted from the write control circuit 16 is inputted.

In FIG. 3, a capacitor C1 illustrated, connected between the bit line BL and the cell power line VDL and a capacitor C2 illustrated, connected between the bit line /BL and the cell power line VDL are parasitic capacitors between the bit lines BL, /BL, and the cell power line VDL.

The write control circuit 16 includes the control signal generating circuits illustrated in FIG. 4 for the respective bit line pairs BL, /BL. The control signal generating circuit illustrated in FIG. 4 includes a write control signal generating circuit 18 which generates a write control signal WEP2, based on a write enabling signal WEP. The write control circuit 16 further includes a column control signal generating circuit 20 which generates a column control signal CSW1, based on a write enabling signal WEP, a write control signal WEP2 and a column select signal COL_SEL.

The write control signal generating circuit 18 generates the write control signal WEP2 which is the write enabling signal WEP delayed by a prescribed period of time by an even number of NOT gates. The delay time of the write control signal WEP2 with respect to the write enabling signal WEP is at least a period of time necessary to discharge the bit line BL from the high level to the low level.

The write control signal generating circuit 18 is not especially limited and can be a delay circuit 22 including an even number of NOT gates serially connected as exemplified in FIG. 4.

The column control signal generating circuit 20 outputs a column control signal CSW1 of the high level when one of the write enabling signal WEP and the write control signal WEP2 is of the high level and the column select signal COL_SEL is of the high level. That is, a column control signal CSW1 which is of the high level only during a delay time from the rise of the write enable signal WEP to the rise of the write control signal WEP2.

The column control signal generating circuit 20 is not especially limited and can be a circuit as exemplified in FIG. 4. In this example, a column control signal CSW1 is produced by subjecting to a logical operation by the AND gate AG1 a signal given by inverting the write control signal WEP2 by the NOT gate NG1 and the write enabling signal WEP, and then subjecting to a logical operation by the AND gate AG2 the output signal of the AND gate AG1 and a column select signal COL_SEL.

In the specification of the present application, the write circuit 14 and the write control circuit 16 are often called collectively the write circuit.

Next, the method of writing into the semiconductor memory device according to the present embodiment will be described with reference to FIGS. 1 to 6.

With the memory cell MC is standing by, the word lines WL is retained at a low level (the reference voltage Vss, e.g., the ground potential 0 V), and the cell power line VDL is retained on a high level (the power voltage Vdd). The write enable signal WEP and the column select signal COL_SEL are retained at the low level. The write control signal WEP2 generated by the write control signal generating circuit 18 and the column control signal CSW1 generated by the column control signal generating circuit 20 are retained at the low level.

As the initial step of writing, the bit line BL and the bit line /BL connected to a memory cell MC to be written in is pre-charged at the voltage Vdd. Thus, the voltage of the bit line BL and the bit line /BL is raised to the voltage Vdd on the higher side (Step S11).

Then, prescribed write voltages are outputted to the data lines WA, WAX from the write amplifier. It is assumed here that the low level voltage Vss is applied to the bit line BL, and the high level voltage Vdd is applied to the bit line /BL. The voltage Vss is outputted to the data line WA, and the voltage Vdd is outputted to the data line WAX. When the high level voltage Vdd is applied to the bit line BL, and the low level voltage Vss is applied to the bit line /BL, the voltage Vdd is applied to the data line WA, and the voltage Vss is applied to the data line WAX.

Then, to the word line WL connected to the memory cell MC to be written in, the high level voltage (the voltage Vdd) is applied to turn on the select transistors (the n-channel MOS transistors NQ3, NQ4) of the memory cell MC to be written in. The write enable signal WEP and the column select signal COL_SEL of the high level are outputted to the write circuit 14 the memory cell MC to be written in connected to.

The write control signal WEP2 is delayed from the write enable signal WEP by a prescribed period of time and remain on the low level immediately after the write enable signal WEP and the column select signal COL_SEL have risen.

Thus, the column control signal CSW1 to be outputted from the column control signal generating circuit 20 becomes the high level. The column control signal CSW1 retains the high level during a period of time until the write control signal WEP2 rises.

When the column control signal CSW1 becomes the high level, the n-channel MOS transistor NT1 turns on, and the bit line BL and the data line WA are connected. Thus, the bit line BL is discharged from the high level to the low level. The n-channel MOS transistor NT2 turns on, and the bit line /BL and the data line WAX are connected. Thus, the bit line /BL is retained at the high level.

The delay time of the write control signal WEP2 with respect to the write enable signal WEP is set at a period of time sufficient for the bit line BL to be discharged from the high level to the low level. Thus, while the column control signal CSW1 is retaining the high level, the bit line BL can be discharged sufficiently from the high level to the low level.

In response to the write enable signal WEP, the voltage of the write assist cell power line VDD_WA is lowered from the high level (the voltage Vdd) by, e.g., about 0.4 V (Step S12). The voltage of the write assist cell power line VDD_WA is lowered so as to lower the voltage of the cell power line VDL upon writing in the memory cell MC in a later step. The voltage width of the write assist cell power line VDD_WA to be lowered is preferably set suitably in consideration of retention characteristics and write characteristics of the memory cell MC.

After the period of time in which the bit line BL is sufficiently lowered from the high level to the low level, the write control signal WEP2 rises to the high level. This signal lowers the column control signal CSW1 from the high level to the low level, and the n-channel MOS transistors NT1, NT2 turn off, and the bit lines BL, /BL are disconnected from the data lines WA, WAX.

At this time, the bit line BL is at the low level, and this low level voltage is applied to the gate electrode of the p-channel MOS transistor PT2, and the p-channel MOS transistor PT2 is ON. Thus, the voltage of the bit line /BL is clamped at the high level voltage Vdd.

In contrast to this, the bit line /BL is at the high level, and this high level voltage is applied to the gate electrode of the p-channel MOS transistor PT1, and the p-channel MOS transistor PT1 is OFF. Thus, the bit line BL becomes floating state.

The write control signal WEP2 rises to the high level, which turns on the n-channel MOS transistor NT3. This connects the cell power line VDL and the write assist cell power line VDD_WA, and the voltage of the write assist cell power line VDD_WA is applied to the cell power line VDL. That is, the voltage of the cell power line VDL becomes a voltage lowered from the voltage Vdd by about 0.4 V (see VDD_cell in FIG. 5).

At this time, the cell power line VDL and the bit line BL are capacitively coupled by the parasitic capacitor C1, and accordingly, the voltage of the bit line BL of the floating state is lowered by lowering of the voltage of the cell power line VDL. Thus, the voltage of the bit line BL shifts to a minus voltage.

Thus, the potential width between the bit line BL and the bit line /BL becomes larger than a difference between the voltage Vdd and the voltage Vss, that is, the voltage of the writing in the memory cell MC becomes relatively large. Coupling with the voltage of the cell power line VDL having lowered, characteristics of writing in the memory cell can be improved (Step S13).

Then, the word line WL is returned to the low level to turn off the n-channel MOS transistors NQ3, NQ4, and the writing in the memory cell MC is completed. The cell power line VDL and the write assist cell power line VDD_WA are returned to the high level voltage Vdd while the bit lines BL, /BL are pre-charged to prepare for a writing in next memory cell MC (Step S14).

Such writing is repeatedly made in a different row address and in a different column address, and the writing in the memory cell array 10 is completed.

FIG. 6 is the graph illustrating the relationship between the capacitance of the parasitic capacitor C1 between the cell power line VDL and the bit line BL, and voltage shift of the bit line BL given by simulation. The ♦ marked plots indicate the computation example of the case that the voltage of the cell power line VDL was lowered from 1.2 V to 0 V under the condition of 25° C. The ■ marked plots indicate the computation example of the case that the voltage of the cell power line VDL was lowered from 1.4 V to 0 V under the condition of 125° C. The ▲ marked plots indicate the computation example of the case that the voltage of the cell power line VDL was lowered from 1.0 V to 0 V under the condition of −40° C. In this simulation, the case that 128 memory cells were connected to the bit line BL was assumed.

It has been confirmed that under all the conditions, as illustrated in FIG. 6, the cell power line VDL is lowered, whereby the voltage of the bit line BL can be shifted to the minus side. The voltage shift of the bit line BL was at maximum substantially a half of a voltage fall of the cell power line VDL although depending on a value of capacitance of the parasitic capacitor C between the cell power line VDL and the bit line BL.

The voltage shift of the bit line BL can be increased as the capacitance of the parasitic capacitor C between the cell power line VDL and the bit line BL is increased. On the other hand, When the capacitance of the parasitic capacitor C between the cell power line VDL and the bit line BL is large, the operational speed lowers. Preferably, the value of the capacitance of the parasitic capacitor C is suitably set based on a harmony between a required write assist effect and the operational speed.

In the method of writing into the semiconductor memory device according to the present embodiment, the parasitic capacitors C1, C2 between the cell power line VDL and the bit lines BL are used when the potential of the bit lines BL is shifted from Vss to minus voltages. The parasitic capacitors C1, C2 are unavoidably generated in the general cell layout in which the cell power line VDL, and the bit lines BL, /BL are arranged in parallel with each other, and the penalty of occupying areas for forming the capacitors is free. In this point, the semiconductor memory device according to the present embodiment can reduce the peripheral circuit area advantageously for the integration in comparison with the layout in which capacitors for shifting the potential Vss of the bit lines from Vss to a minus voltage are arranged outside the memory cells for the respective bit lines.

By using the switch circuit using the p-channel MOS transistors PT1, PT2, only one of a pair of the bit lines BL, /BL can be disconnected. The use of this circuit decreases the control circuit and consequently can reduce the peripheral circuit area further advantageously for the integration (see the reference embodiment to be described later).

As described in the reference embodiment to be described later, in the case that SRAMs of various constitutions and scales are controlled by one kind of the capacitor arranged outside the memory cells, the capacitance is constant irrespective of a number of the memory cells associated with the bit lines, which, depending on SRAM constitutional differences, the assist characteristics dependency is generated. Generally, the design is intended for safety, and in the SRAM of a large constitution, the assist effect decreases. Oppositely, in the case that the capacitors are arranged in accordance with an SRAM constitution, the design scale becomes very large, and the design cost increases.

In this point, according to the semiconductor memory device according to the present embodiment, capacitors are added in proportion with a Row number (a numbers of cells to be driven), whereby the write assist effect can be constantly high irrespective of the SRAM constitution (scale).

As described above, according to the present embodiment, the parasitic capacitor between the bit line and the cell power line is utilized to lower a voltage of the data line of low data to be written, whereby the operations of writing into the memory cell are promoted, and the write margin can be improved. The capacitor used to generate the negative voltage is the parasitic capacitor between the bit line and the cell power line, which permits a most part of the control circuit to be applied to the existing write circuit, whereby the increase of the circuit area can be drastically suppressed. A capacitance proportional to a Row number, whereby the write assist effect can be constantly high irrespective of the SRAM constitution.

A Second Embodiment

A semiconductor memory device and a method of writing into the same according to a second embodiment will be described with reference to FIGS. 7 and 8. The same members of the present embodiment as those of the semiconductor memory device and the method of writing into the same according to the first embodiment illustrated in FIGS. 1 to 6 are represented by the same reference numbers not to repeat or to simplify the description.

Figure 7:
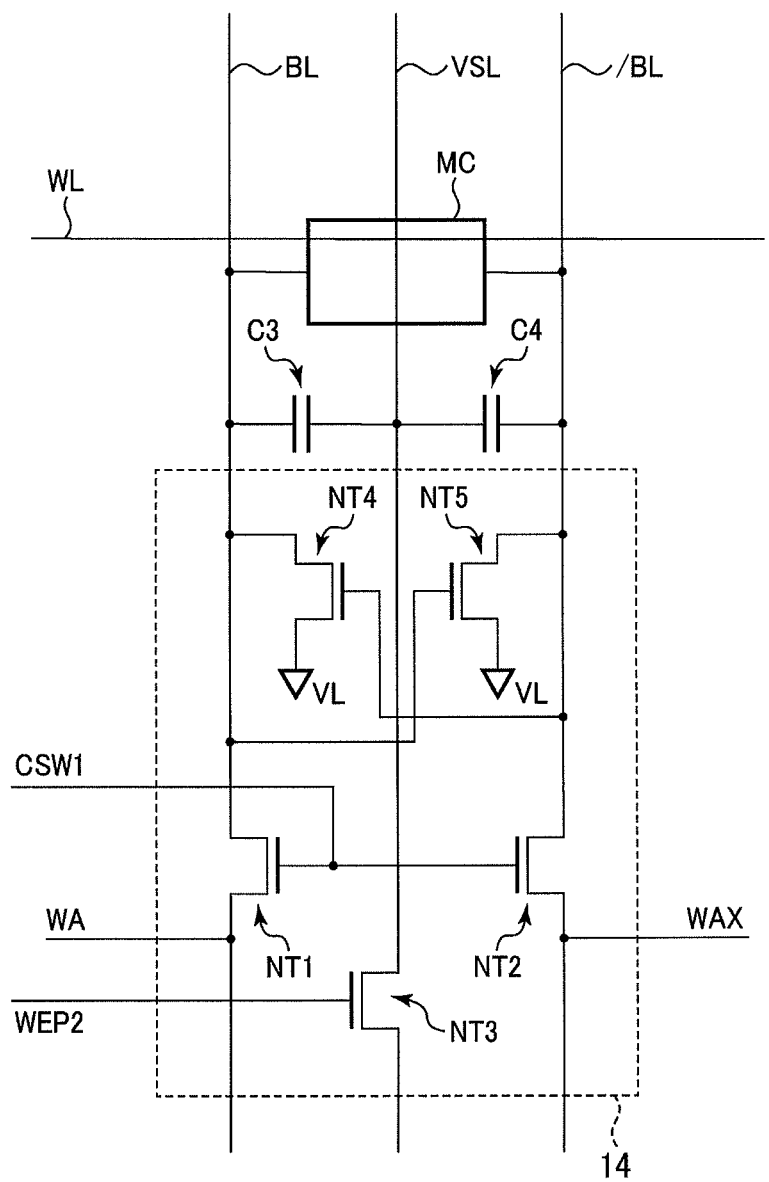
FIG. 7 is a circuit diagram illustrating a structure of a write circuit of the semiconductor memory device according to a second embodiment.
Figure 8:
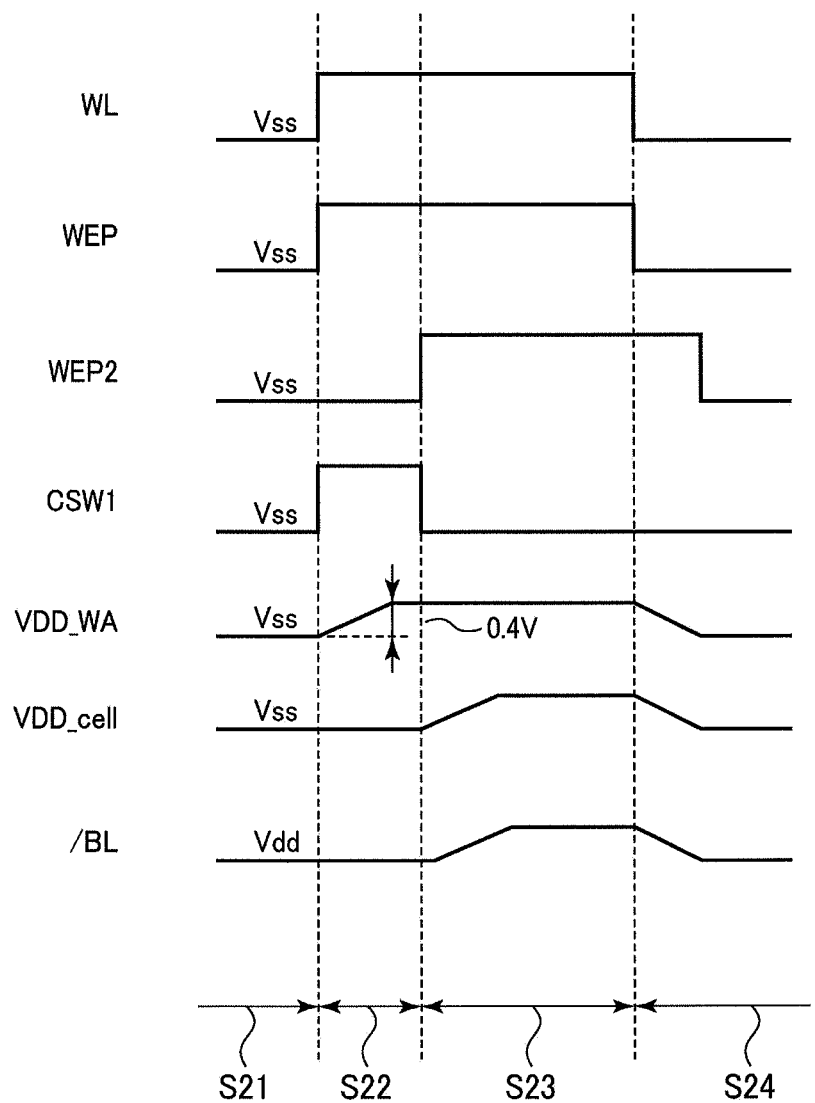
FIG. 8 is a time chart illustrating a method of writing into the semiconductor memory device according to the second embodiment.

FIG. 7 is a circuit diagram illustrating a structure of a write circuit of the semiconductor memory device according to the present embodiment. FIG. 8 is a time chart illustrating the method of writing into the semiconductor memory device according to the present embodiment.

First, the structure of the semiconductor memory device according to the present embodiment will be described with reference to FIG. 7.

The semiconductor memory device according to the present embodiment is the same as the semiconductor memory device according to the first embodiment illustrated in FIGS. 1 to 4 except that the circuit structure of the write circuit 14 is different, and the a cell power line VSL is used in place of the cell power line VDL. The cell power line VSL is the cell power line connected to the low-side power nodes VL in the memory cell of FIG. 2.

As illustrated in FIG. 7, the write circuit 14 includes an n-channel MOS transistor NT1 and an n-channel MOS transistor NT4 connected to the bit line BL. The write circuit 14 further includes an n-channel MOS transistor NT2 and an n-channel MOS transistor NT5 connected to the bit line /BL. The write circuit 14 further includes an n-channel MOS transistor NT3 connected to the cell power line VSL.

The n-channel MOS transistor NT4 is connected between the bit line BL and the row-side power node VL and has the gate electrode connected to the bit line /BL. The n-channel MOS transistor NT5 as well is connected between the bit line /BL and the row-side power node VL and has the gate electrode connected to the bit line BL. The n-channel MOS transistors NT4, NT5 function as the switch circuit which, when one of a pair of the bit line BL, /BL is on the high level, and the other is on the low level, clamps one to a reference voltage and disconnects the other from the power source.

The gate electrode of the n-channel MOS transistor NT1 and the gate electrode of the n-channel MOS transistor NT2 are connected to each other and are connected to the writ control circuit 16. To the gate electrode of the n-channel MOS transistor NT1 and the gate electrode of the n-channel MOS transistor NT2, a column control signal CSW1 outputted from the write control circuit 16 is inputted.

A data line WA is connected to the bit line BL via the n-channel MOS transistor NT1. A data line WAX is connected to the bit line /BL via the n-channel MOS transistor NT2. To the data lines WA, WAX, complementary writ signals are outputted from a write amplifier (not illustrated) upon writing in the memory cell MC.

A write assist cell power line VDD_WA is connected to the cell power line VSL via the n-channel MOS transistor NT3. The n-channel MOS transistor NT3 functions as a switch circuit for switching a voltage to be applied to the cell power line VSL upon writing from a reference voltage to a write assist voltage higher than the reference voltage.

The gate electrode of the n-channel MOS transistor NT3 is connected to the write control circuit 16. To the gate electrode of the n-channel MOS transistor NT3, a write control signal WEP2 outputted from the write control circuit 16 is inputted.

A parasitic capacitor C3 is formed between the bit line BL and the cell power line VSL. A parasitic capacitor C4 is formed between the bit line /BL and the cell power line VSL.

As described above, the write circuit 14 of the semiconductor memory device according to the present embodiment includes the n-channel MOS transistors NT4, NT5 in place of the p-channel MOS transistors PT1, PT2 of the write circuit 14 of the semiconductor memory device according to the first embodiment. The parasitic capacitors C3, C4 are formed between the bit lines BL and the cell power line VSL in place of the parasitic capacitors C1, C2 between the bit lines BL and the cell power line VDL.

Next, the method of writing into the semiconductor memory device according to the present embodiment will be described with reference to FIGS. 7 and 8.

When the memory cell MC is standing by, the word line WL is retained at the low level, the cell power line VDL (not illustrated) is retained at the high level, and the cell power line VSL is retained at the row level. The write enable signal WEP and the column select signal COL_SEL are retained at the low level. The write control signal WEP2 generated by the write control signal generating circuit 18 and the column control signal CSW1 generated by the column control signal generating circuit 20 are retained at the low level.

As the initial step of a write, the bit line BL and the bit line /BL connected to the memory cell to be written in are pre-charged to the voltage Vdd. Thus, the voltage of the bit line BL and the bit line /BL are raised to the voltage Vdd on the high-side (Step S21).

Then, prescribed write voltages are outputted from the write amplifier to the data lines WA, WAX. It is assumed here that the low level voltage Vss is applied to the bit line BL and the high level voltage Vdd is applied to the bit line /BL, and the voltage Vss is outputted to the data line WA, and the voltage VDD is outputted to the data line WA.

Then, the high level signal is outputted to the word line WL connected to the memory cell MC to be written in, and the select transistors (the n-channel MOS transistors NQ3, NQ4) of the memory cell MC to be written are tuned on. The write enable signal WEP of the high level and the column select signal COL_SEL are outputted to the write circuit 14 connected to the memory cell MC to be written.

The write control signal WEP2 is delayed from the write enable signal WEP by a prescribed period of time and remain on the low level immediately after the write enable signal WEP and the column select signal COL_SEL have risen.

Thus, the column control signal CSW1 to be outputted from the column control signal generating circuit 20 becomes the high level. The column control signal CSW1 retains the high level during a delay time until the write control signal WEP2 rises.

When the column control signal CSW1 becomes the high level, the n-channel MOS transistor NT1 turns on, and the bit line BL and the data line WA are connected. Thus, the bit line BL is discharged from the high level to the low level. The n-channel MOS transistor NT2 turns on, and the bit line /BL and the data line WAX are connected. Thus, the bit line /BL is retained at the high level.

In response to the write enable signal WEP, the voltage of the write assist cell power line VDD_WA is raised from the low level (the voltage Vss) to, e.g., about 0.4 V (Step S22).

After a period of time in which the bit line BL sufficiently lowered from the high level to the low level, the write control signal WEP2 rises and become the high level. This signal lowers the column control signal CSW1 from the high level to the row level, the n-channel MOS transistors NT1, NT2 turn off, and the bit lines BL, /BL are disconnected from the data lines WA, WAX.

At this time, the bit line /BL is at the high level, and this high level voltage is applied to the gate electrode of the n-channel MOS transistor NT4, and the re-channel MOS transistor NT4 is on. Thus, the voltage of the bit line BL is clamped to the low level voltage Vss.

In contrast to this, the bit line BL is at the low level, the voltage of the low level is applied to the gate electrode of the n-channel MOS transistor NT5, and the n-channel MOS transistor NT5 is off. Thus, the bit line /BL is floating state.

The write control signal WEP2 rises and become the high level, which turns on the n-channel MOS transistor NT3. Thus, the cell power line VSL and the write assist cell power line VDD_WA are connected, and the voltage of the write assist cell power line VDD_WA is applied to the cell power line VSL. That is, the voltage of the cell power line VSL becomes a voltage raised from the voltage Vss by about 0.4 V (see VDD_cell in FIG. 8).

At this time, the cell power line VSL and the bit line /BL are capacitively coupled by the parasitic capacitor C4, and accordingly, the voltage of the bit line /BL of the floating state is raised by rising of the voltage of the cell power line VSL. Thus, the voltage of the bit line BL is shifted to a higher potential.

Thus, the potential width between the bit line BL and the bit line /BL becomes larger than a difference between the voltage Vdd and the voltage Vss, that is, the voltage of writing in the memory cell MC becomes relatively high. Coupled with the rise of the voltage of the cell power line VSL, characteristics of writing in the memory cell MC can be improved (Step S23).

Then, the word line WL is returned to the low level to turn off the n-channel MOS transistors NQ3, NQ4, and the writing in the memory cell MC is completed. The cell power lines VSL and the write assist cell power line VDD_WA are returned to the low level voltage Vss while the bit lines BL, /BL are pre-charged to prepare for writing in a next memory cell MC (Step S24).

This writing is repeatedly made in a different row address and a different column address, and the writing in the memory cell array 10 is completed.

As described above, according to the present embodiment, the parasitic capacitor between the bit line and the cell power line is utilized to raise a voltage of the data line of high data to be written, whereby the operations of writing into the memory cell are promoted, and the write margin can be improved. The capacitor used to raise the voltage is the parasitic capacitor between the bit line and the cell power line, which permits a most part of the control circuit to be applied to the existing write circuit, whereby the increase of the circuit area can be drastically suppressed. A capacitance proportional to a Row number, whereby the write assist effect can be constantly high irrespective of the SRAM constitution.

A Reference Embodiment

A semiconductor memory device and a method of writing into the same according to a reference embodiment will be described with reference to FIGS. 9 to 12. The same members of the present embodiment as those of the semiconductor memory device and the method of writing into the same according to the first and the second embodiments illustrated in FIGS. 1 to 8 are represented by the same reference numbers not to repeat or to simplify the description.

Figure 9:
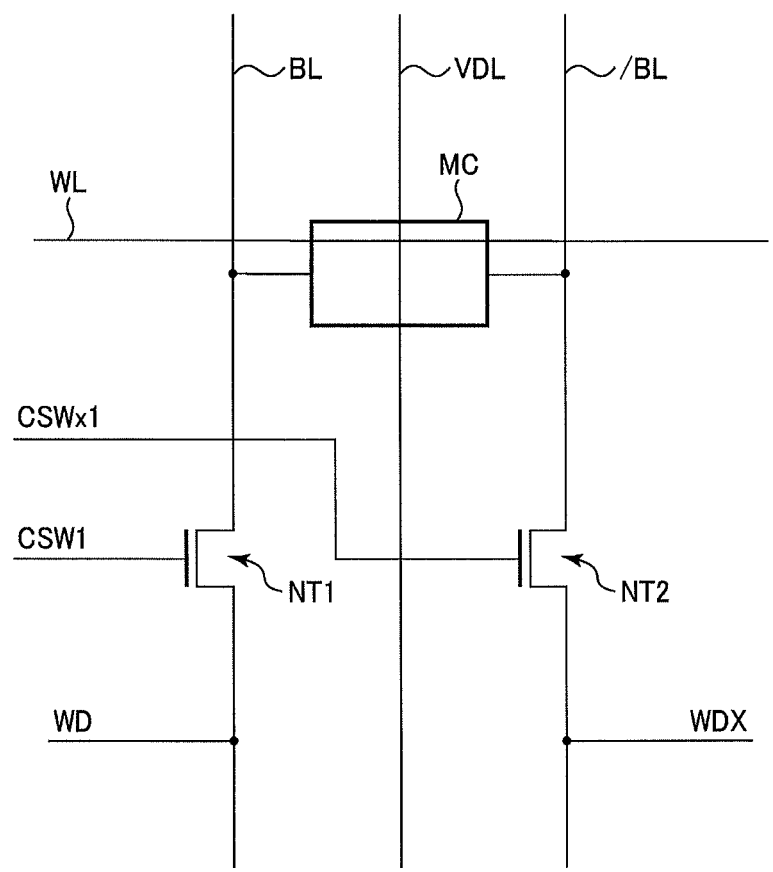
FIG. 9 is a circuit diagram illustrating a structure of a semiconductor memory device according to a reference embodiment.
Figure 10:
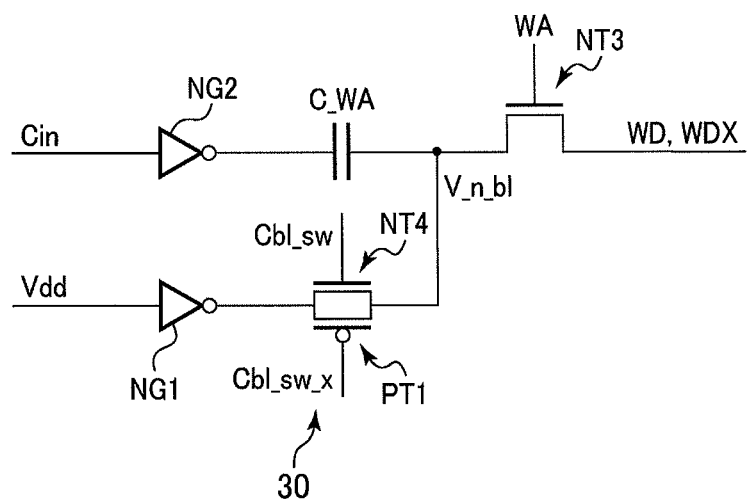
FIG. 10 is a circuit diagram illustrating a structure of a write assist circuit of the semiconductor memory device according to the reference embodiment.
Figure 11:
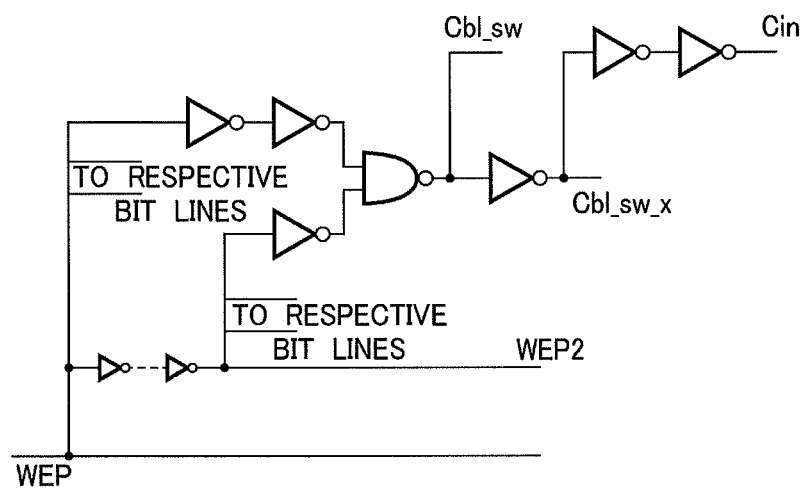
FIG. 11 is a circuit diagram illustrating a structure of a signal control circuit of the semiconductor memory device according to the reference embodiment.

FIG. 9 is a circuit diagram illustrating a structure of the semiconductor memory device according to the present embodiment. FIG. 10 is a circuit diagram illustrating a structure of a write assist circuit of the semiconductor memory device according to the present embodiment. FIG. 11 is a circuit diagram illustrating a structure of a signal control circuit of the semiconductor memory device according to the present embodiment. FIG. 12 is a time chart illustrating the method of writing into the semiconductor memory device according to the present embodiment.

First, the structure of the semiconductor memory device according to the present embodiment will be described with reference to FIGS. 9 to 12.

As illustrated in FIG. 9, the semiconductor memory device according to the present embodiment includes the n-channel MOS transistor NT1 connected to the bit line BL and the n-channel MOS transistor NT2 connected to the bit line BL. The data line WD is connected to the bit line BL via the n-channel MOS transistor NT1. The data line WDX is connected to the bit line /BL via the n-channel MOS transistor NT2.

A write assist circuit illustrated in FIG. 10 is connected to the data lines WD, WDX. That is, to the data lines WD, WDX, the switch circuit 30 including an re-channel MOS transistor NT4 and a p-channel MOS transistor PT1 parallelly connected, and a capacitor C_WA are connected via the n-channel MOS transistor NT3. To the other end of the switch circuit 30, the voltage Vdd is inputted via a NOT gate NG1. To the other end of the capacitor C_WA, a signal Cin is inputted via a NOT gate NG2.

A signal Cbl_sw is inputted to the gate electrode of the n-channel MOS transistor NT4. A signal Cbl_sw_x is inputted to the gate electrode of the p-channel MOS transistor PT1. The signal Cin, the signal Cbl_sw and the signal Cbl_sw_x are generated by, e.g., the circuit as exemplified in FIG. 11. The relationships between there signals and the write enable signal WEP are as illustrated in FIG. 12.

Next, the method of writing into the semiconductor memory device according to the present embodiment will be described with reference to FIGS. 9 to 12.

When the memory cell MC is standing by, the word line WL is retained at the low level, and the cell power line PVL is retained at the high level. The write enable signal WEP and the column select signals CSW1, CSWx1 are retained at the low level. The signal WEP2, the signal Cbl_sw, the signal Cbl_sw_x and the signal Cin are retained by the circuit of FIG. 11 respectively at the low level, the high level, the low level and the low level.

First, as the initial step of writing, the bit line BL and the bit line /BL connected to the memory cell MC to be written in is pre-charged. Thus, the voltage of the bit line BL and the bit line /BL is raised to the high-side voltage Vdd (Step S31).

Then, the data lines WD, WDX and the bit lines BL, /BL on the side of writing zero are discharged from the high level to the low level. The case that the side of the data line WD and the bit line BL is discharged to the low level is assumed here. The signal WA to be connected to the gate electrode of the n-channel MOS transistor NT3 and the column select signal CSW1 to be connected to the gate electrode of the n-channel MOS transistor NT1 are raised to the high level. The bit line BL and the data line WD thus connected to the node V_n_bl at the low level and are discharged. At this time, a terminal of the capacitor C_WA on the side of the node V_n_bl is at the low level, a terminal of the capacitor C_WA on the side of the NOT gate NG2 is at the high level, and the voltage Vdd is applied to the capacitor C_WA (Step S32).

Then, the signal WEP2 is raised by the circuit FIG. 11, delayed from the write enable signal WEP. The signal Cbl_sw is inversed from the high level to the low level, and the signal Cbl_sw_x is inversed from the low level to the high level. Thus, the switch circuit 30 is turned off, and the node V_n_bl becomes floating state.

Next, the signal Cin is inversed from the low level to the high level by the circuit of FIG. 11. The NOT gate NG2 side of the capacitor device C_WA is lowered to the low level, and due to the effect of the capacitor device C_WA, the node V_n_bl has a negative voltage.

Thus, a write voltage of a voltage width above the power voltage Vdd can be applied between the bit line BL and the bit line /BL, and write characteristics of the writing in the memory cell can be improved (Step S33).

Then, the word line WL is returned to the low level to turn off the n-channel MOS transistors NQ3, NQ4, and the writing in the memory cell MC is completed (Step S34).

This writing is repeatedly made in a different row address and a different column address, and the writing in the memory cell array 10 is completed.

In the method of writing into the semiconductor memory device according to the present embodiment, in order to generate a negative voltage to be used for writing, the capacitor C_WA having a capacitance substantially equal to a capacitance associated with the bit line must be provided for each bit line, which causes large area increases. An additional control circuit for generating and applying a negative voltage must be prepared, which also cause large area increases.

In characteristics control, in the case that SRAMs of various constitutions and scales are controlled by one kind of the capacitor, the capacitance is fixed irrespective of a cell numbers associated with the bit lines, and consequently, depending on SRAM constitutional differences, the assist characteristics dependency is generated. Generally, the design is intended for safety, and in the SRAM of a large constitution, the assist effect decreases. Oppositely, in the case that the capacitors are arranged in accordance with the SRAM constitution, the design scale becomes very large, and the design cost increases.

Modified Embodiments

Embodiments of the semiconductor memory device and the method of writing into the same have been described, but the present invention is not limited to the above-described embodiments and can cover other various modifications, additions, replacements, etc. within the scope of the spirits of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor memory device comprising:
   a memory cell;
   a pair of bit lines connected to the memory cell;
   a cell power line connected to the memory cell and having parasitic capacitors between the pair of bit lines;
   a first switch circuit which is connected to the pair of bit lines and a power voltage line;
   a second switch circuit which is connected to the cell power line and a write assist cell power line; and
   a write control circuit configured to control the pair of bit lines, the first switch circuit and the second switch circuit,
   wherein the write control circuit applies a first voltage of a high level to one bit line of the pair of bit lines and a second voltage of a low level being lower than the high level to the other bit line of the pair of bit lines, connects said one bit line to the power voltage line and disconnects said the other bit line from the power voltage line by the first switch circuit, and then connects the cell power line to the write assist cell power line by the second switch circuit, and
   wherein a voltage of the write assist cell power line is lower than the first voltage.

2. The semiconductor memory device according to claim 1, wherein
   the first switch circuit includes
      a first p-channel MOS transistor connected between said one bit line and the power voltage line and having a gate electrode connected to said the other bit line, and
      a second p-channel MOS transistor connected between said the other bit line and the power voltage line and having a gate electrode connected to said one bit line.

3. The semiconductor memory device according to claim 1, further comprising:
   a plurality of the pair of bit lines; and
   a plurality of the memory cells connected to the respective pairs of bit lines.

4. A semiconductor memory device comprising:
   a memory cell;
   a pair of bit lines connected to the memory cell;
   a cell power line connected to the memory cell and having parasitic capacitors between the pair of bit lines;
   a first switch circuit which is connected to the pair of bit lines and a reference voltage line;
   a second switch circuit which is connected to the cell power line and a write assist cell power line; and
   a write control circuit configured to control the pair of bit lines, first switch circuit and the second switch circuit,
   wherein the write control circuit applies a first voltage of a high level to one bit line of the pair of bit lines and a second voltage of a low level being lower than the high level to the other bit line of the pair of bit lines, connects said the other bit line to the reference voltage line and disconnects said one bit line from the reference voltage line by the first switch circuit, and then connects the cell power line to the write assist cell power line by the second switch circuit, and
   wherein a voltage of the write assist cell power line is higher than the first voltage.

5. The semiconductor memory device according to claim 4, wherein
   the first switch circuit includes
      a first n-channel MOS transistor connected between said one bit line and the reference voltage line and having a gate electrode connected to said the other bit line, and
      a second n-channel MOS transistor connected between said the other bit line and the reference voltage line and having a gate electrode connected to said one bit line.

6. The semiconductor memory device according to claim 4, further comprising:
   a plurality of the pair of bit lines; and
   a plurality of the memory cells connected to the respective pairs of bit lines.

7. A method of writing into a semiconductor memory device including a memory cell, a pair of bit lines connected to the memory cell, and a cell power line connected to the memory cell, comprising:
   applying a first voltage to one bit line of the pair of bit lines and a second voltage to the other bit line of the pair of bit lines;
   floating said one bit line, clamping a voltage of said the other bit line to the second voltage, then shifting a voltage of the cell power line, and thereby shifting the voltage of said one bit line capacitively coupled with the cell power line to a third voltage; and
   writing in the memory cell by the first voltage applied to said one bit line and the third voltage applied to said the other bit line.

8. The method of writing into a semiconductor memory device according to claim 7, wherein the voltage of the cell power line is so shifted that a difference between the first voltage and the third voltage is larger than a difference between the first voltage and the second voltage.

9. The method of writing into a semiconductor memory device according to claim 7, wherein in applying the voltage to the pair of bit lines, the first voltage of a low level is applied to said one bit line, and the second voltage of a high level being higher than the low level is applied to said the other bit line, and in shifting the voltage of said one bit line to the third voltage, the voltage of the cell power line is lowered from the second voltage to a fourth voltage lower than the second voltage to thereby shift the voltage of said one bit line to the third voltage lower than the first voltage.

10. The method of writing into a semiconductor memory device according to claim 7, wherein in applying the voltage to the pair of bit lines, the first voltage of a high level is applied to said one bit line, and the second voltage of a low level being lower than the high level is applied to said the other bit line, and in shifting the voltage of said one bit line to the third voltage, the voltage of the cell power line is raised from the first voltage to a fourth voltage higher than the first voltage to thereby shift the voltage of said one bit line to the third voltage higher than the first voltage.

* * * * *